United States Patent
Berneking et al.

(10) Patent No.: US 11,988,731 B2
(45) Date of Patent: May 21, 2024

(54) IMAGING DEVICE, METHOD FOR DESIGNING A CIRCUIT BOARD ARRANGEMENT, AND CIRCUIT BOARD ARRANGEMENT

(71) Applicant: Bruker BioSpin MRI GmbH, Ettlingen (DE)

(72) Inventors: Arne Berneking, Karlsruhe (DE); Thorsten Greeb, Karlsruhe (DE)

(73) Assignee: BRUKER BIOSPIN MRI GMBH, Ettlingen (DE)

( * ) Notice: Subject to any disclaimer, the term of this patent is extended or adjusted under 35 U.S.C. 154(b) by 68 days.

(21) Appl. No.: 17/548,951

(22) Filed: Dec. 13, 2021

(65) Prior Publication Data
US 2022/0099769 A1 Mar. 31, 2022

Related U.S. Application Data

(63) Continuation of application No. PCT/EP2020/065708, filed on Jun. 5, 2020.

(51) Int. Cl.
*G01R 33/48* (2006.01)
*G01R 33/34* (2006.01)
(Continued)

(52) U.S. Cl.
CPC ....... *G01R 33/48* (2013.01); *G01R 33/34007* (2013.01); *G01R 33/385* (2013.01); *G01T 1/1642* (2013.01); *G01T 1/2985* (2013.01)

(58) Field of Classification Search
CPC .............. G01R 33/48; G01R 33/34007; G01R 33/385; G01R 33/36; G01R 33/42; G01R 33/481; G01T 1/1642; G01T 1/2985; H05K 1/02; H05K 3/10
See application file for complete search history.

(56) References Cited

U.S. PATENT DOCUMENTS

| | | |
|---|---|---|
| 3,757,028 A | 9/1973 | Schlessel et al. |
| 5,504,273 A | 4/1996 | Nakanishi |
| (Continued) | | |

FOREIGN PATENT DOCUMENTS

| | | |
|---|---|---|
| DE | 102005033989 A1 | 2/2007 |
| EP | 0650318 A1 | 4/1995 |
| (Continued) | | |

OTHER PUBLICATIONS

Berneking et al., "RF Coil Performance in a Compact Hybrid MR-PET Scanner Using an Integrated Shielding", Annual Meeting of ISMRM, Apr. 2017, 15 pp.
(Continued)

*Primary Examiner* — G. M. A Hyder
(74) *Attorney, Agent, or Firm* — Edell, Shapiro & Finnan, LLC

(57) ABSTRACT

A magnet arrangement arranged radially around a sample volume generates a changing magnetic field B with a z-direction component. A circuit board arrangement (6;14) is arranged radially within the magnet arrangement and has electrical conductor tracks (7; 12) divided into conductor track sections (10), at least two adjoining ones of which form a structure section (11a, 11b) spanning an area (A1, A2). For each conductor track (7; 12), two structure sections (11a, 11b) respectively form a structure section pair (11), wherein the conductor tracks are arranged on the circuit board arrangement (6; 14) such that equal and opposite voltages and/or currents are induced by a change in the magnetic field B of the magnet arrangement in the two structure sections of each structure section pair. As a result, eddy currents and resultant interference in the circuit board and the components thereof are avoided or at least minimized.

15 Claims, 5 Drawing Sheets

(51) Int. Cl.
    *G01R 33/385*    (2006.01)
    *G01T 1/164*     (2006.01)
    *G01T 1/29*      (2006.01)

(56) References Cited

U.S. PATENT DOCUMENTS

| | | |
|---|---|---|
| 9,488,703 B2 | 11/2016 | Rey et al. |
| 2004/0262036 A1 | 12/2004 | Brist et al. |
| 2007/0018647 A1 | 1/2007 | Freytag |
| 2012/0022364 A1 | 1/2012 | Caruba et al. |

FOREIGN PATENT DOCUMENTS

| | | | | |
|---|---|---|---|---|
| EP | 2413673 A2 * | 2/2012 | ........... | H05K 1/0245 |
| EP | 3428671 A1 | 1/2019 | | |
| FR | 2838234 A1 * | 10/2003 | ........... | H01B 7/0876 |
| GB | 2482860 A * | 2/2012 | ........... | H05K 1/0245 |
| JP | H07202358 A | 8/1995 | | |
| WO | 2013118060 A1 | 8/2013 | | |
| WO | 2017186687 A1 | 11/2017 | | |

OTHER PUBLICATIONS

Berneking et al., "Design and Characterization of a Gradient-Transparent RF Copper Shield for PET Detector Modules in Hybrid MR-PET Imaging", IEEE Transactions on Nuclear Science vol. 64 No. 5, May 2017, pp. 1118-1127.

Iagaru et al., "PET System Technology Designs for Achieving Simultaneou PET/MRI", PET/ MRI in Oncology—Current Clinical Applications, ISBN 978-3-319-68517-5, Springer Int'l Publishing AG 2018, p. 11.

\* cited by examiner

IMAGING DEVICE, METHOD FOR DESIGNING A CIRCUIT BOARD ARRANGEMENT, AND CIRCUIT BOARD ARRANGEMENT

CROSS REFERENCE TO RELATED APPLICATIONS

This application claims foreign priority under 35 U.S.C. § 119(a)-(d) to German Application No. 10 2019 116 322.6 filed on Jun. 14, 2019, the entire contents of which are hereby incorporated into the present application by reference.

FIELD OF THE INVENTION

The invention relates to an imaging device comprising a magnet arrangement arranged radially around a sample volume and serving to generate a magnetic field with a magnetic field component in the z-direction, said magnetic field changing during operation of the magnet arrangement, and a circuit board arrangement arranged radially within the magnet arrangement and having electrical conductor tracks divided into conductor track sections, wherein at least two conductor track sections adjoining one another form a structure section spanning an area. The invention also relates to a method for designing a circuit board arrangement, and to such a circuit board arrangement.

BACKGROUND

One challenge in imaging devices having circuit board arrangements and changing magnetic fields is to prevent interference and mutual influences of magnet arrangement and circuit board arrangement. In this regard, in hybrid imaging devices, for example, the components of the two imaging modalities must not mutually influence one another. In PET (Positron-Emission Tomography)/MR (Magnetic resonance) hybrid scanners, for example, on the one hand, the PET electronics components interact with the sensitive magnetic fields of the MR tomograph; on the other hand, the strong MR magnetic fields influence the PET electronics and thus the PET data acquisition.

Preventing interactions with changing magnetic fields (e.g. gradient fields of gradient coils and radio-frequency fields of the transmitting and receiving coils) requires other methods, however.

Transmitting and receiving RF coils of an MR tomograph are tuned to the Larmor frequency and generate a magnetic field B1 in the MHz range with an amplitude in the µT range perpendicular to the B0 orientation in order to excite spins. As a result of the high frequency of the changing magnetic field, the generation of an electric field component cannot be prevented. In this case, the power reaches the kW range and disturbs the PET electronics.

Furthermore, RF coils are able to detect very small signals of excited spins, wherein a received signal can be in the µV range. Therefore, MRT transmitting and receiving coils are very noise-sensitive and can detect even tiny (disturbing) signals if the latter are in the range of the Larmor frequency of the MRT scanner. Since modern PET/MR hybrid scanners contain a multiplicity of electronic elements, inter alia FPGAs, ASICs and various signal lines in the MHz range and even the digitization of the PET data in the MRT scanner can take place with broadband noise, emitted signals of the PET electronics can disturb or be completely superposed on the received signal of the RF coils, such that detection of the MR signals can become impossible.

In order to prevent these reciprocal influences, shielding methods and techniques [1, 2] are available which are known to a person skilled in the art and which enable shielding of the radio frequency signal.

However, the devices for shielding measures suitable for shielding radio-frequency fields of the transmitting and receiving coils are not suitable for shielding gradient fields.

Gradient fields are stationary magnetic fields which can have a field strength in the range of up to a few 100 mT and whose gradient changes in the range of up to a few 100 mT per meter. Three superposed gradient fields are situated in the examination object: the x-gradient $G_x*z$, which runs as linearly as possible along an x-direction and the field component of which is oriented in a z-direction, the y-gradient $G_y*z$, which runs as linearly as possible along a y-direction and the field component of which is oriented in the z-direction, and the z-gradient $G_z*z$, which changes as linearly as possible along the z-direction and the field component of which is oriented in the z-direction.

The gradient coil arrangement with the gradient coils is generally situated radially outside the PET ring arrangement. The gradient fields cause a spatial encoding of the MRT received signal with a frequency and phase encoding being achieved with a suitable sequential programming of the x-, y- and z-gradients. Just like the $B_0$ field, the gradient fields should not be influenced by PET components in the field of view because otherwise the spatial encoding of the MRT image is disturbed. The same applies to all components that are introduced radially within the gradient coil arrangement, including the RF transmitting/receiving coils coil.

Since gradient fields are stationary magnetic fields, the gradient fields can furthermore be altered and thus disturbed by currents induced owing to these gradient fields on conductive structures: if the gradient coils are switched on and off, which happens during every MRT examination, eddy currents are induced on all electrically conductive structures and in particular on relatively large conductor areas on printed circuit boards (PCBs) and the shielding areas of shielding units. The induced eddy currents themselves generate a magnetic field, which is superposed on the gradient fields and thus disturbs the frequency and phase encoding and therefore ultimately the spatial resolution of the MRT images and can furthermore result in an undesired evolution of heat caused by these eddy currents. This is particularly critical for MRT sequences having a so-called high "duty cycle", such as EPI or diffusion imaging, in which gradient coils are switched as rapidly as possible and often in succession with a high gradient amplitude. In this case, not only do eddy currents occur on closed areas, but induced currents and voltages also occur on conductor tracks and other metallic structures. The eddy current problem occurs particularly in the case of circuit boards that have supply lines, since the supply lines are embodied as large area supply layers in order to ensure stable supply voltages and to avoid voltage differences. Layers are likewise necessary in other PCB applications, such as, for example, in the construction of microstrip lines or lines in which the line impedance has to be predefined. It is therefore customary in many applications to provide large metal areas on the circuit board arrangements. The eddy current problem described above occurs in this case, however. The eddy currents that arise disturb the electronics and can result in a large buildup of heat, which can likewise bring about problems or necessitate more expensive and more complex cooling mechanisms.

In MRT and in particular PET/MR system development, for cost reasons it is attempted to achieve as compact a design as possible. The smaller the diameter of the MR magnet, the lower is the price for this MR system. Moreover, it is advantageous to bring both the MRT receiving coil and the PET detectors as near as possible to the examination object in order to achieve an optimum signal-to-noise ratio of the detection of the MRT imaging and high sensitivity of the PET imaging and at the same time to save PET detectors. In such compact imaging devices, PET detectors with electronics and shielding are situated near the examination object, with the result that the induced currents and voltages have a particularly pronounced effect on the MRT image and the PET electronics.

In order to prevent disturbing alterations of the gradient fields in the examination object with image disturbances and artefacts and likewise to prevent induced voltages from destroying components or adversely affecting the function thereof, and in order to prevent induced voltages from being coupled into signal lines, suitable methods have to be used in order to prevent the eddy currents to the greatest possible extent and in order to prevent induced signals or voltages.
Suppression and Reduction of Eddy Currents The suppression and reduction of eddy currents on conductive areas of shielding devices is described in [1, 2], for example. An RF shield is generally an electrically conductive layer, for example composed of copper, silver or silver-coated copper. In order to suppress eddy currents, slots are inserted. The latter are normally capacitively connected. Since all gradient fields are aligned in the z-direction, an electric field component with x- and y-orientation arises during the switching of the gradients. In order to suppress eddy currents as effectively as possible, the slots are oriented along the z-direction, since the electric field components are thus oriented perpendicular to the slots. Slots can also be integrated in PET shields in accordance with this method.

In order to suppress eddy currents on planar supply layers, analogously to shielding devices described above, the supply layers can be provided with slots along the z-direction (see FIG. 4). [3] describes an MR-compatible device which has an RF shield and at the same time is intended to suppress eddy currents. In that case, a net or a perforated metal plate is used as RF shield.

It is also possible, instead of shielding areas composed of metal, to provide shielding areas composed of other materials having a lower conductivity in order to suppress eddy currents. For example, carbon can be used as material in this case. The published patent application [4] describes an RF shield comprising a carbon fiber-reinforced layer for reducing the eddy currents. The reduced conductivity suppresses induced currents, but the relative shielding strength of carbon is also significantly lower. In order to attain a desired shielding strength, therefore, it is necessary to provide a comparatively thicker shield, which results in an increased spatial requirement.
Avoidance of Induced Currents and Voltages In order to avoid induced currents and voltages on circuit board arrangements and electrical components, it is not possible to replace the conductive material of the circuit boards with a less conductive material, since a maximum conductivity of the conductor tracks is essential in circuit board arrangements. The most common method of preventing induced voltages, currents and instances of coupling-in on PCB signal and supply voltage lines is to design the course of the conductor tracks (routing of the conductor tracks) on the circuit board arrangements such that as far as possible no loops arise. In general, signal and supply lines are routed and distributed from a specific starting point (plug connector) on the circuit board arrangement. For example, triangular or U-shaped structures spanning a large area arise very easily as a result. If the magnetic field is perpendicular to the circuit boards and thus perpendicular to the lines and the spanned areas, this results in considerable instances of coupling-in and induced voltages and currents on signal and supply lines, as a result of which the electronics can be significantly disturbed or electronic elements and components can even be damaged or destroyed. Therefore, in general, the circuit boards are aligned parallel to the magnetic gradient fields and thus along a z-direction. By way of example, [5] discloses the fact that a nuclear magnetic resonance apparatus can include a shielding arrangement comprising an electrically conductive layer with a continuous slot that is axially symmetrical with respect to the z-axis.

As long as the electronics are situated in a region in which all gradient fields are oriented along the z-direction, the eddy current problem and the problems associated with induced currents can be solved by way of the measures described above. On account of the compact design desired particularly in hybrid scanners, however, PET components are usually positioned very near to the gradient coils. Specifically, the circuit boards are situated very near to the coils of the x- and y-gradient coil systems. At these locations, the magnetic fields of the gradients have no field profile along the z-direction. Consequently, the field lines have x- and y-components at these locations. This has the consequence that the field lines directly cross circuit boards that are positioned there. Gradient fields $G_x\text{*}x$, $G_x\text{*}y$, $G_y\text{*}x$ and $G_y\text{*}y$ thus result. Field portions $G_z\text{*}x$ and $G_z\text{*}y$ can likewise be present at the edges of the z-gradients and outside the z-gradient coil system. As a consequence, methods mentioned above, such as introducing slots along the z-direction the circuit board, still have to be applied; at the aforementioned positions near to the x- and y-gradient coil systems, however, said slots suppress only the z-gradient field portions within the z-gradient coil system.

SUMMARY

It is an object of the invention to provide an imaging device in which, firstly, eddy currents generated by gradient fields along the z-direction and, secondly, disturbances of the printed circuit board and of the components thereof caused by voltages and currents induced by gradient fields having x- and y-field components are avoided or at least minimized.

Description of the Invention

This object is achieved with an imaging device as claimed herein, a method for designing a circuit board arrangement as claimed herein, and a circuit board arrangement as claimed herein.

According to the invention, two structure sections form a respective structure section pair for each conductor track, moreover, the conductor tracks are arranged on the circuit board arrangement such that a change in the magnetic field of the magnet arrangement induces equal and opposite voltages and/or currents in the two structure sections of each structure section pair.

A plurality of adjacent conductor track sections form a respective structure section, wherein each structure section spans a geometric area. An "area spanned by a structure section" should be understood to mean the area enclosed by the conductor sections of the respective structure section and the direct connection of the ends of the structure section. Within a structure section, the conductor track sections either all form a positive angle of <180° or all form a negative angle of >180° with one another.

One underlying aspect of the invention involves choosing the geometric course of the conductor tracks such that voltages and currents induced by magnetic field changes cancel one another out as much as possible. According to the invention, therefore, for each area spanned by one structure section there exists an area which is spanned by another structure section and which is "aligned" oppositely; i.e. the conductor track sections of one structure section form an angle α with one another, while the conductor track sections of the other structure section form an angle −α with one another.

Two structure sections aligned oppositely form a structure section pair if the induced voltages/currents have similar magnitudes, i.e. deviate from one another by less than 20% in terms of magnitude.

To that end, it is advantageous if the structure sections are chosen to be as small as possible in order that the induced currents/voltages of adjacent structure sections do not change to an excessively great extent in terms of magnitude on account of the possibly present inhomogeneity of the magnetic field generated by the magnet arrangement.

The conductor track sections preferably run rectilinearly, wherein at least two rectilinear conductor track sections adjoining one another are arranged in an angular fashion with respect to one another.

Adjacent structure sections share at least one conductor track section, that is to say that for the case where a structure section comprises n conductor track sections, 2n−1 conductor track sections form two structure sections. Each conductor track section which is not aligned parallel to the z-axis and does not form the beginning or the end of the conductor track is part of two structure sections.

Preferably, in each structure section at least two conductor track sections are aligned obliquely with respect to the z-direction.

The structure sections which form a structure section pair are preferably arranged close to one another. In one preferred embodiment, therefore, the structure sections of a structure section pair have at least one conductor track section in common. That is to say that the structure sections of a structure section pair are then "adjacent" structure sections that share a conductor track section.

Preferably, the conductor track comprises a plurality of structure section pairs having the same geometric structure. The conductor track thus has at regular intervals a geometric structure that is repeated in the z-direction.

In one particularly preferred embodiment, the conductor tracks run in zigzag fashion on the circuit board arrangement. In this case, each structure section comprises two conductor track sections and spans a triangular area. Such a triangular structure can be calculated in a simple manner and can easily be implemented on the circuit board arrangement.

In one particularly preferred embodiment of the imaging device according to the invention, the conductor track sections of a structure section are aligned at an angle of 30° to 60°, ideally of ±45°, with respect to the z-direction. The more the conductor tracks deviate from an alignment in the z-direction, the greater the extent to which eddy currents can propagate in the x- and y-directions. However, if the alignment of the conductor tracks deviates only little from the z-direction, this has the geometric consequence that larger areas are spanned by the structure sections. As a result, the induced voltages increase and larger voltage shifts occur within the circuit board, which should be prevented as far as possible, however. An alignment of ±45° relative to the z-direction has proved to be a good compromise that yields very good results.

In order to reduce the level of the eddy currents that occur, the length of the conductor track sections can be reduced and the number of conductor track sections and structure sections can be increased.

Preferably, the areas spanned by structure sections of a structure section pair have the same shape and the same surface area. However, the areas of a structure section pair are "aligned" in the opposite direction in relation to the z-direction, with the result that voltages having the same magnitude but different signs are induced in the event of a magnetic field change in the structure sections of a structure section pair.

Preferably, the conductor sections of a structure section are of the same length. The conductor sections of a structure section preferably form equal and opposite angles with the z-direction.

The conductor tracks are preferably arranged ("routed") such that the areas spanned by the structure sections lie in that rectangular region which is defined by a simple L-connection between a starting point and an end point of the conductor track, which are spaced apart from one another both in the z-direction and in a direction perpendicular to the z-direction. If the routed region (region within which the conductor track is routed) goes beyond this region required for a simple L-connection, the induced areas are unnecessarily large. This could lead to problems since, as a result, the induced voltages within the individual structure sections increase and local potential shifts can influence the electronics situated on the circuit board arrangement. That means that the paths of the conductor track ought to be minimized despite the zigzag course during "routing". That is to say that the conductor track is intended to connect two linking points (starting point, end point) as directly as possible, ideally exclusively with structure section pairs.

The electrical conductor tracks are preferably signal lines for transmitting electrical signals and/or planar supply lines for voltage supply.

The signal lines are non-differential signal lines. Differential signal lines are understood to mean two lines routed parallel in order to eliminate disturbances induced therein through difference formation. According to the invention, only one signal line (that is to say a non-differential signal line) is used for the transmission of a signal, which results in a saving of material. Induced disturbances are eliminated by the routing according to the invention.

If supply lines are intended to be used as radio-frequency shielding, it is advantageous to cover the entire circuit board area with the conductor track material (e.g. copper) (supply layer). In order nevertheless to be able to effectively damp eddy currents as a result of alternating magnetic fields, the copper area is slotted. The supply layer then comprises a plurality of conductor tracks connected to one another. It is necessary to find a compromise with regard to the width of the conductor tracks of a supply layer: on the one hand, the conductor tracks of the supply layer should be as narrow as possible in order that only low eddy currents are induced; on the other hand, this means additional outlay in terms of production engineering. Furthermore, there is a capacitive coupling between the conductor tracks if too many slots are present. The strip width of the conductor tracks of a supply layer is typically chosen to be less than 10 to 15 mm.

In one particularly preferred embodiment of the imaging device according to the invention, the circuit board arrangement is multilayered. The conductor track sections preferably extend at least partly over a plurality of circuit board layers. In this case, they run via through contacts via which the two circuit board layers are electrically connected to one another. This is relevant in particular in the case of planar supply lines for voltage supply, since the latter, as described above, generally run over the entire area of the circuit board arrangement in order to produce a stable supply network on the entire circuit board arrangement. With a single circuit board layer, however, it would not be possible to construct a continuously electrically connected area since the structure sections would overlap. Provision of two circuit board layers enables line segments that overlap to be arranged on different circuit board layers (planes). If the entire area of the circuit board arrangement is covered by the structure sections, the planar supply lines can also serve as RF shielding.

One specific embodiment provides for both planar supply lines for voltage supply and at least one signal line to be arranged at least on one of the circuit board layers. The circuit board layer with the planar conductor track sections can thus be used as radio-frequency shielding of the signal lines.

The magnet arrangement is preferably a gradient system of an MM or MPI imaging unit. Typical gradient frequencies at which the magnetic field changes are less than 100 kHz.

Preferably, the circuit board arrangement comprises emission tomography electronics, in particular PET or SPECT (single photon emission computed tomography) electronics.

The imaging device can also comprise a unit (e.g. headphones) to be attached to an object to be examined, wherein the circuit board arrangement is part of the unit to be attached to the object to be examined.

In one particularly preferred embodiment, the imaging device is a hybrid imaging device comprising, firstly, a magnetic resonance tomography (MRT) or magnetic particle imaging (MPI) arrangement and, secondly, an emission tomography (ET) arrangement.

The invention also relates to a method for designing a circuit board arrangement for use in an imaging device as described and/or claimed herein, wherein the circuit board arrangement comprises electrical conductor tracks divided into conductor track sections, wherein at least two conductor track sections adjoining one another form a structure section spanning an area. According to the invention, the geometric course of the conductor tracks on the circuit board arrangement is chosen such that each conductor track has structure section pairs comprising in each case two structure sections in which equal and opposite voltages and currents are induced by a change in the magnetic field of the magnet arrangement.

Preferably, the length of the conductor track sections and the angles at which the conductor track sections are aligned relative to a z-direction are used as parameters for designing the circuit board arrangement. The length of the conductor track sections and the angles at which the conductor track sections are aligned relative to the z-direction determine the shape of the area that are spanned by the respective structure section.

In the case of particularly great gradients, in the case of spanning large areas or in the case of magnetic fields that do not have a linear profile, it may be that the field strength of the magnetic field changes greatly over the location. This has the consequence that the induced voltages turn out to be different even for structure sections spanning identical areas. These differences should compensate for one another on average with longer signal lines and larger spanned areas. However, local differences can occur which can locally influence the electronic behavior. One preferred variant of the method according to the invention therefore provides for the size and/or geometric shape of the areas spanned by the individual structure sections to be determined depending on a magnetic field profile and/or gradient field profile of the imaging device. The influences described above can be reduced by including the profile of the changing magnetic field (e.g. the gradient field profile in the case of MRT and MPI applications) in the arrangement of the conductor track sections. If the gradient field profile is known by way of simulation or measurements, the course of the conductor tracks can be adapted such that the size of the areas spanned by the structure sections compensates for the field strength differences.

The invention also relates to a circuit board arrangement which was designed according to the methods described above for use in an imaging device as described above.

Further advantages of the invention are evident from the description and the drawing. Likewise, the features mentioned above and those that will be explained even further can be used according to the invention in each case individually by themselves or as a plurality in any desired combinations. The embodiments shown and described should not be understood as an exhaustive enumeration, but rather are of exemplary character for outlining the invention.

DETAILED DESCRIPTION

Figure 1:
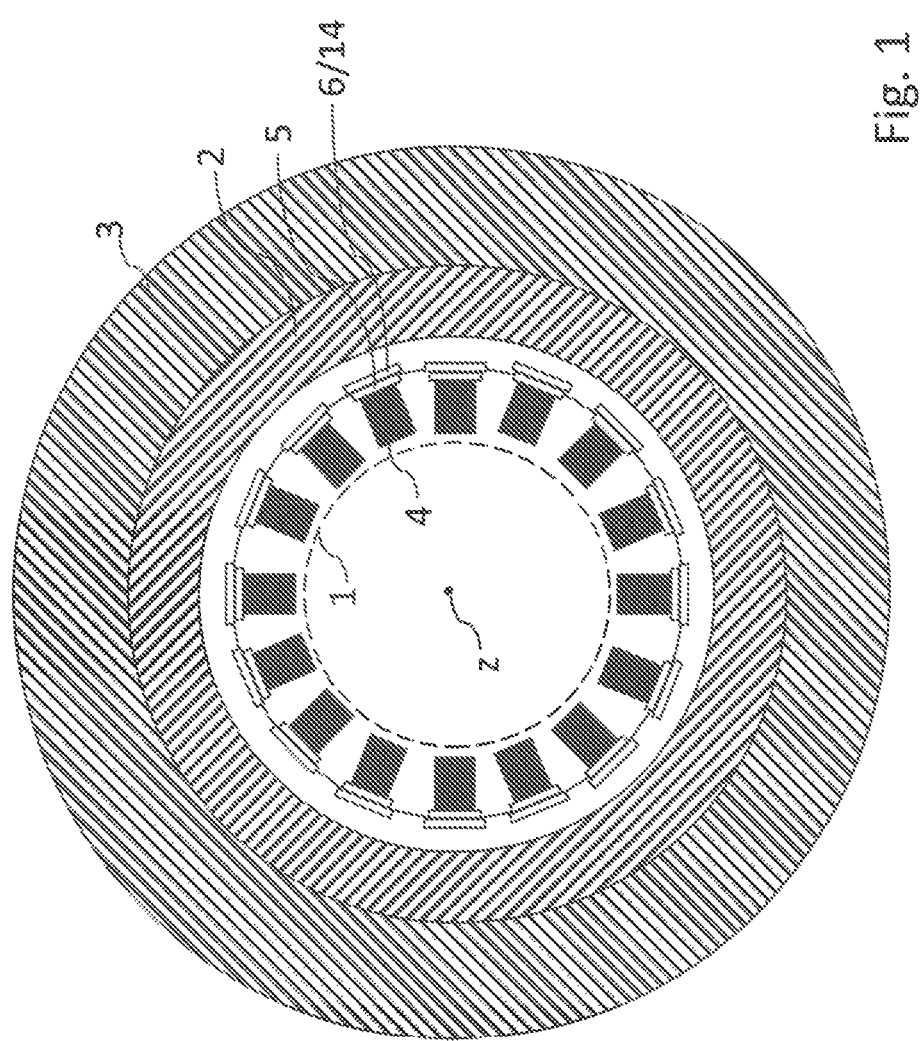
FIG. 1 shows a cross section of an MR-PET hybrid imaging device

FIG. 1 shows an imaging device according to the present invention comprising an MR arrangement and a PET arrangement. The MR arrangement comprises a magnet arrangement having a longitudinal axis z. The magnet arrangement comprises an RF resonator structure 1 and a gradient coil system 2 for generating a changing magnetic field (gradient field) and a main magnet 3 for generating a static magnetic field. The PET arrangement is arranged coaxially with respect to the magnet arrangement and comprises scintillator crystals 4, a photosensor 5 (having a plurality of sensor elements) for detecting photons generated in the scintillator crystals 4, and a circuit board arrangement 6 with PET electronics. The circuit board arrangement 6 is arranged radially between the gradient coil system 2 and the RF resonator structure 1.

Figure 2:
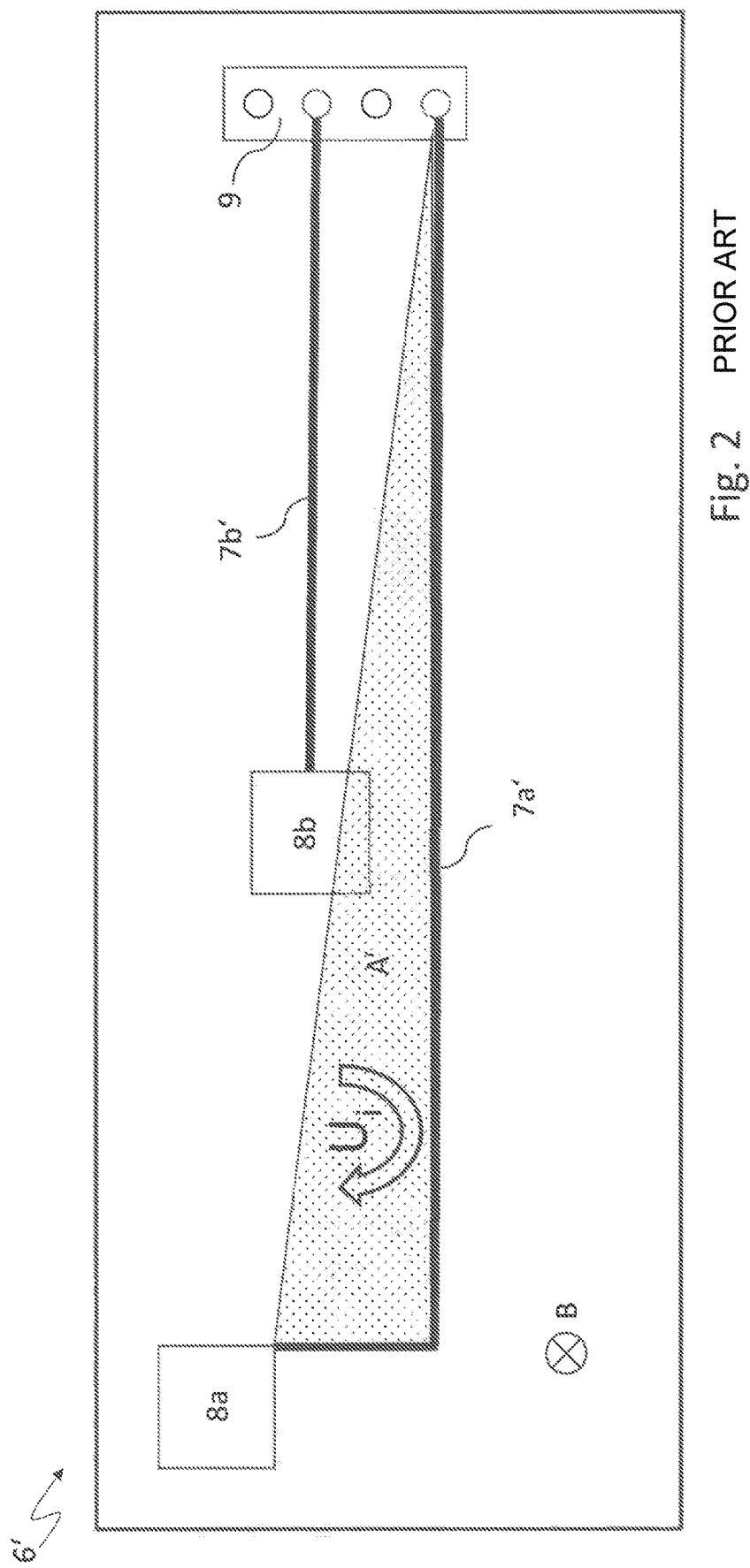
FIG. 2 shows a circuit board arrangement with a signal line routed in an L-shaped fashion in accordance with the prior art.

FIG. 2 shows a circuit board arrangement 6' in accordance with the prior art comprising signal lines 7a', 7b', which respectively connect an electronic component 8a, 8b to a plug connector 9. Depending on the arrangement of the components 8a, 8b relative to the plug connector 9, the signal lines 7a', 7b' cannot always run parallel to the z-direction. Particularly if the signal lines 7a', 7b' have to be routed around other components, L- or U-shaped structures arise, for example. In this regard, for example, the signal line 7a' cannot be routed directly from the plug connector to the electronic component 8a since it has to be routed around the other electronic component 8b. The signal line 7a' therefore runs in an L-shaped fashion from the plug connector 9 to the electronic component 8a and in so doing spans an area A'. In the event of a change in a magnetic field B permeating the circuit board arrangement, said area A' spanned by the signal line 7a' can already result in induced voltages and currents on the signal line 7a' which can influence, be superposed on or disturb signals or even damage components. While cables can simply be twisted in order to avoid these disturbing influences, this is possible only to a limited extent in the case of signal lines in the form of conductor tracks: "twisted pair routing" on circuit boards can only ever be applied to two or a very small number of signal lines and the number of circuit board layers is also limited. If the conductor tracks are twisted relative to one another at the circuit board level, this also does not mean that the U-shaped or L-shaped structures are prevented. Induced currents are thus maintained even in the case of such signal lines. Differential signal transmission can provide a remedy for signal line routing, such as "Low Voltage Differential Signaling" (LVDS), for example. However, it is not always possible or desirable to use differential signal transmission, particularly in the case of analog lines.

Figure 3:
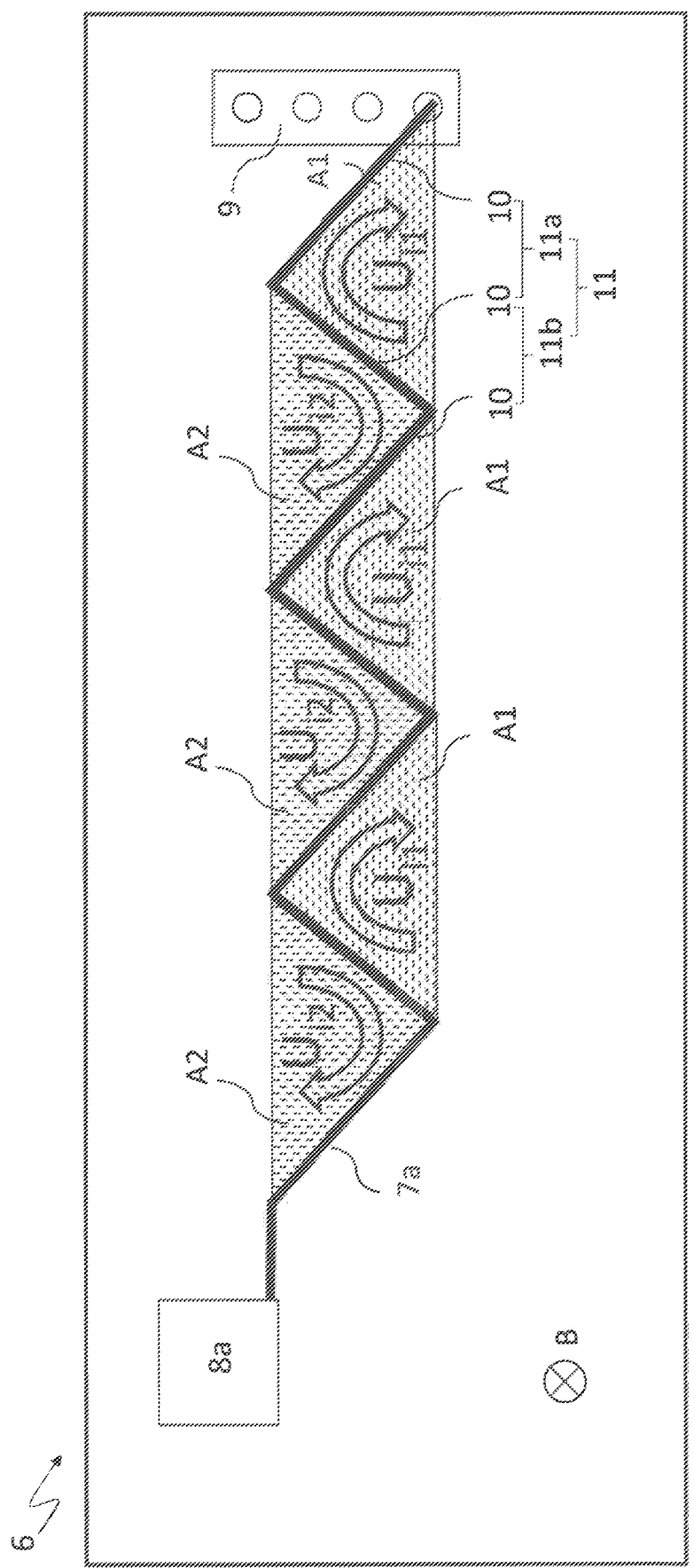
FIG. 3 shows a circuit board arrangement with a signal line routed in zigzag fashion according to the invention.

FIG. 3 shows a circuit board arrangement 6 according to the invention, which enables this problem to be solved. For the sake of clarity, only the electronic component 8a is shown here. The electronic component 8a is electrically connected to the plug connector 9 via a conductor track 7a. The conductor track 7a runs in zigzag fashion from the plug connector 9 to the electronic component 8a and is subdivided into conductor track sections 10, wherein two conductor track sections 10 together form a v-shaped structure section 11a, 11b. Apart from the two outer conductor track sections (starting section and end section), each conductor track section 10 is part of two structure sections 11a, 11b. Each structure section 11a, 11b spans a triangular area A1, A2, wherein the triangular areas A1 in FIG. 3 open (are aligned) downward, i.e. are not delimited by the conductor tracks 7a toward the bottom, while the triangular areas A2 in FIG. 3 are open (aligned) upward, i.e. are not delimited by the conductor tracks 7a toward the top.

The conductor track routing according to the invention does indeed initially increase the total size of the areas A1, A2 which contribute to induction. However, as a result of the zigzag routing, the areas A1, A2 are arranged such that adjacent triangular areas A1, A2 of the same size arise, which are repeated at regular intervals. In each case two triangular areas A1, A2 (in the example shown, the triangular areas of two adjacent structure sections 11a, 11b) are aligned relative to one another here, as described above, that is to say form an inverting structure. In the event of changes in the magnetic field B, therefore, an induced voltage $U_{i1}$ resulting in an induced current $I_{i1}$ is generated by one structure section 11a, while an induced voltage $U_{i2}$ resulting in an induced current $I_{i2}$ is generated by the adjacent structure section 11b. Since the areas A1, A2 of the triangular areas spanned by the two structure sections 11a, 11b are of the same size and are aligned oppositely, it holds true that $U_{i1}=-U_2$ and $I_{i1}=-I_{i2}$. The resulting induced voltages and currents thus cancel one another out. The two structure sections 11a, 11b form a structure section pair 11. Instances of coupling-in of gradient fields having x- and y-portions can thus be prevented in relation to the entire conductor track.

Figure 4:
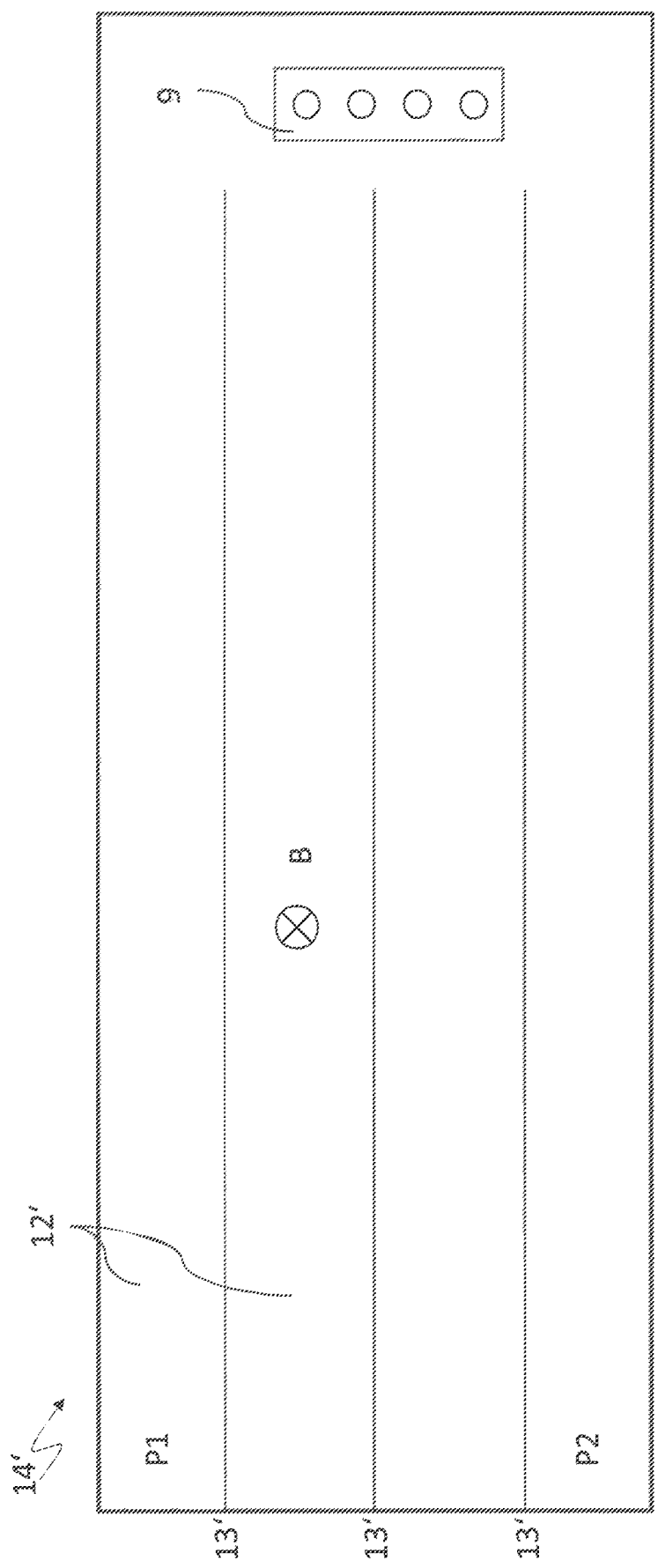
FIG. 4 shows a circuit board arrangement with planar supply lines in accordance with the prior art.

In the case of circuit board arrangements comprising planar supply lines, a further difficulty is added: the supply lines form a supply layer that covers a large area, usually the entire area of a multilayered circuit board. However, strong eddy currents can form on large metallic areas. In order to avoid this, in circuit board arrangements known from the prior art, slots parallel to the z-direction are introduced into the supply layer. FIG. 4 shows one such circuit board arrangement in accordance with the prior art comprising planar supply lines 12', which are separated from one another via slots 13' and form a supply layer. A voltage can be applied to the supply layer via the plug connector 9. The slots 13' do not run completely over the circuit board arrangement, since an electrical contact has to be provided for the propagation of the supply network. The four supply lines 12' illustrated in FIG. 4 are therefore electrically connected to one another via the right edge of the supply layer. As a result, the supply lines 12' form a U-shaped structure from a point P1 in the top left corner to a point P2 in the bottom left corner of the circuit board arrangement 14'. That means that in the case of a magnetic field change ΔB, e.g. in the case of the switching of a gradient coil system, an induced voltage is present along said U-shaped structure. This can influence, disturb or even damage electronic components. Moreover, it is possible for these induced voltages to be transmitted to signal lines possibly present, particularly if, for example, preamplifiers are supplied with different voltages.

Other coupling mechanisms via signal lines or other electronic components can also take place. If a magnetic field ΔB in the region of 10 mT passing through the circuit board arrangement 14' is assumed, the induced voltage can thus be estimated as follows. The magnitude of the induced voltage is calculated according to the law of induction and Ampere's circuital law using the following equation: U=ΔB/Δt*A. Assuming a rise time Δt of the gradient of 0.2 ms and, for example, an area A of the supply layer of 0.38*0.025 m², an induced voltage U of 475 mV results. Depending on the position of the circuit board arrangement 14', the gradient strength and the rise time of the gradient fields, significantly higher voltages can also be induced. The voltages induced in the supply lines 12' cannot simply be prevented by causing the slots 13' in the supply layer to run in a different direction, since the size of the inducing area is principally defined by the points P1 and P2. If the slots 13' e.g. all ran triangularly instead of straight, the points P1 and P2 would nevertheless remain connected via the lateral connection at the right-hand side of the supply layer. In other words, the induction-effective area between these two potential points P1, P2 would therefore not change.

Figure 5A:
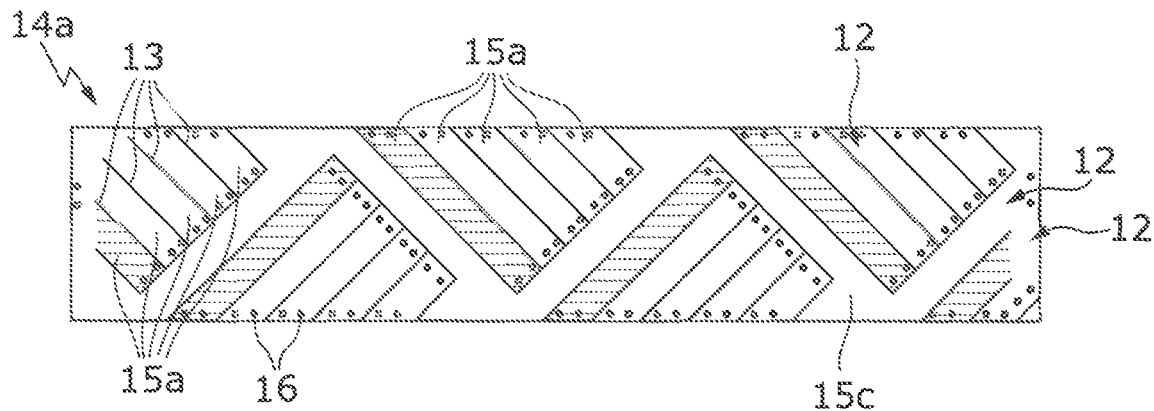
FIG. 5A shows a first circuit board layer of a multilayered circuit board arrangement with planar supply lines according to the invention.
Figure 5B:
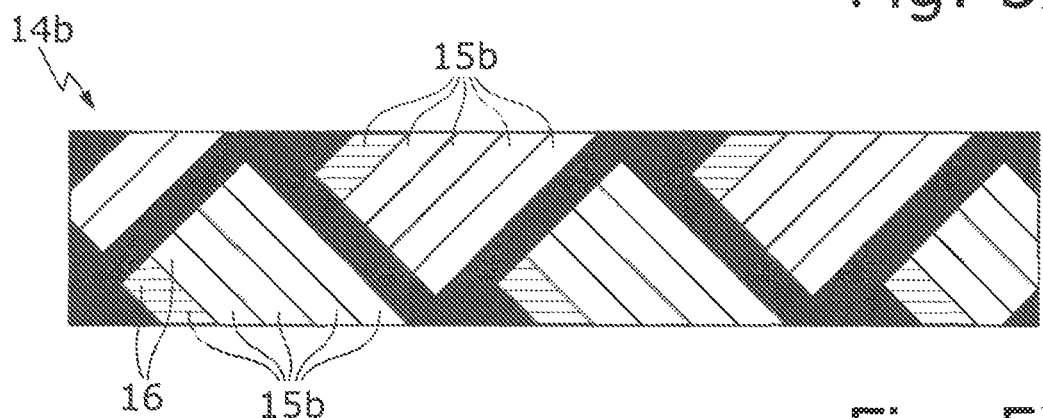
FIG. 5B shows a second circuit board layer of a multilayered circuit board arrangement with planar supply lines according to the invention.

However, the conductor track routing according to the invention as described above on the basis of signal lines can nevertheless also be applied to the design of supply layers. To that end, the circuit board arrangement according to the invention is of two-layered configuration. FIGS. 5A and 5B respectively show a circuit board layer 14a, 14b of such a circuit board arrangement 14 according to the invention, in the case of which both eddy currents and induced voltages can be reduced. The supply layer is provided with oblique slots 13, which divides the supply layer into substantially strip-shaped segments 15a, 15b and a zigzag segment 15c. The segments 15a, 15c of the first circuit board layer 14a are electrically connected to the segments 15b of the second circuit board layer 14b via through contacts 16. Upon following the electrical connections along the segments 15a, 15b and through the through contacts 16 in FIGS. 5A, 5B, it is evident that the segments 15a, 15b form supply lines 12 having a triangular structure which run over the entire circuit board.

In contrast to the circuit board arrangement shown in FIG. 4, here the supply lines 12 are routed such that, firstly, they run in zigzag fashion and, secondly, the slots 13 (considered over both circuit board layers 14a, 14b) extend over the entire length of the circuit board arrangement. By way of example, three of the supply lines 12 illustrated are shown with hatching in FIGS. 5A, 5B, wherein two of the hatched supply lines are routed over both circuit board layers 14a, 14b and comprise segments 15a, 15b. The third hatched supply line 12 consists of the zigzag segment 15c and runs only on the first circuit board layer 14a.

What is achieved by the routing over a plurality of circuit board layers 14a, 14b is that the supply lines 12 can span opposite areas over the entire length of the circuit board arrangement.

It becomes clear from FIG. 5A that the supply layer occupies the entire circuit board region (minus the slots 13) and the supply network can thus propagate on the entire circuit board layer 14a. Since there is no need for the entire lower circuit board layer 14a to be occupied for the purpose of constructing the triangular structure, the unrequired region (shown black in the illustration in FIG. 5B) has been left free. There it is possible for example to route a signal line in a triangular structure (as shown in FIG. 3) or to add a continuous additional supply line having a triangular structure in order to obtain two circuit board layers 14a, 14b completely occupied by supply networks. These two circuit board layers 14a, 14b can then be used to shield signal lines in one or a plurality of intervening circuit board layers.

Figure 6:
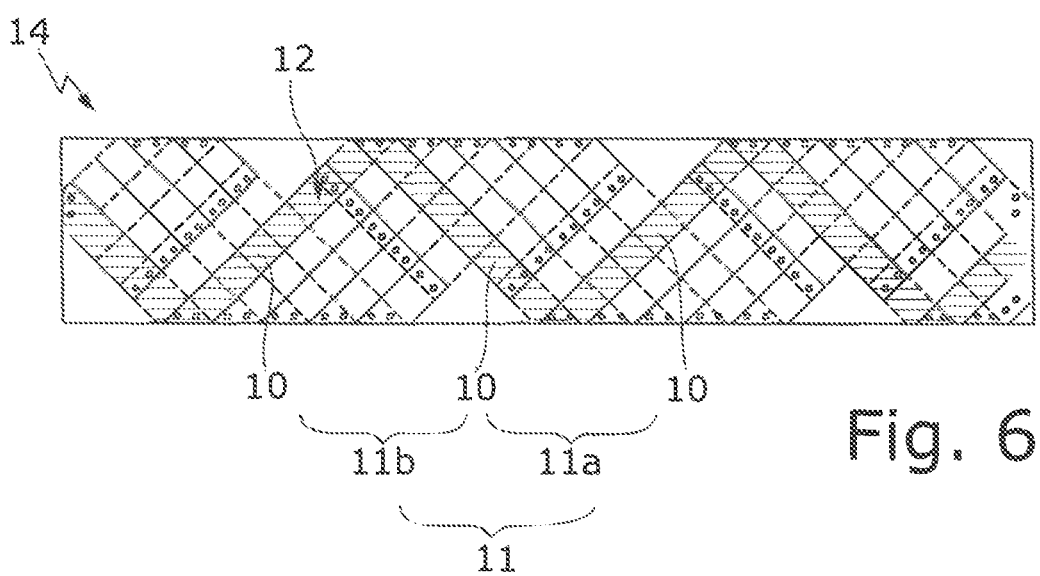
FIG. 6 shows a superimposed illustration of the planar supply lines of the circuit board arrangement shown in FIGS. 5A and 5B.

FIG. 6 shows the circuit board arrangement 14 according to the invention with the two circuit board layers 14a, 14b in a superimposed illustration. The triangular structure of the conductor tracks 12 is readily discernible here (one supply line 12 has been hatched by way of example). The supply tracks 12 run in zigzag fashion and are subdivided into conductor track sections 10, wherein in each case two conductor track sections 10 form a v-shaped structure section 11a, 11b spanning a triangular area, analogously to the signal line 7a shown in FIG. 3.

The slots 13 of the first circuit board layer 14a are illustrated with solid lines, and those of the second circuit board layer 14b with dashed lines. Where the segments 15a of the first circuit board layer 14a overlap the segments 15b of the second circuit board layer 14b, the supply tracks 12 are routed further to the respective other circuit board layer 14a, 14b of the circuit board arrangement 14.

The routing over a plurality of circuit board layers as shown in FIGS. 5A, 5B and 6 enables structure section pairs 11a, 11b to be arranged over the entire circuit board arrangement 14, wherein structure sections 11a, 11b of the various conductor tracks 12 overlap in some segments in a projection onto the circuit board area. The overlapping segments 15a, 15b are arranged on different circuit board layers 14a, 14b. This does mean that an additional circuit board layer 14b and thus an increased material outlay are required; however, said additional circuit board layer 14b can be used as additional radio-frequency shielding for signal lines arranged between the two circuit board layers.

FIGS. 3 and 5A, 5B respectively show a zigzag course of the conductor tracks 7a, 12 with right-angled structure sections 11a, 11b, wherein the conductor sections are inclined by 45° relative to the z-direction. This course of the conductor tracks 7a, 12 shown illustrates just one specific example, however, which has the advantage that it is easy to implement since the routing on the circuit board arrangement 6, 14 and the calculations turn out to be simple. Other structures, e.g. meandering rectangular or trapezoidal structures, sinusoidal structures, and non-isosceles triangular structures are also conceivable, for example. The alignment of the conductor track sections 10 relative to the z-direction can likewise deviate from 45° in principle. Deviations from a triangular structure with other angles can be expedient depending on the application; for example, in the case of very strong gradients and in regions in which these change very greatly in the field profile, it can be expedient for the structure sections to form smaller triangles with higher angles.

However, the conductor track structures shown in FIGS. 3, 5A, 5B constitute one particularly preferred embodiment for the following reasons: it has already been explained above that the introduction of slots 13' parallel to the z-direction, depending on the positioning of the circuit board arrangement, suppresses eddy current effects as a result of field components in the x- and y-direction if the circuit board areas are likewise aligned parallel to the z-direction. The greater the deviation from a slot orientation strictly parallel to the z-direction, the greater the extent to which eddy currents can propagate in the x- and y-direction. Measurements have shown that the eddy currents that occur in the case of a 45° alignment of the conductor track sections relative to the z-direction are still sufficiently low. If excessively high eddy currents should nevertheless occur, as a countermeasure it is possible to increase the number of slots or to decrease the slot spacings.

With the use of angles of less than 45° relative to the z-direction (shallow angle) for the alignment of the conductor track sections, the structure sections span larger areas. The induced voltages increase as a result. Larger voltage shifts thus occur within the circuit board arrangement, which should be prevented as far as possible. Moreover, the gradient fields change depending on the x-y-z-position. Therefore, the structure sections 11a, 11b of a structure section pair 11, the induced currents/voltages of which substantially mutually neutralize one another, should always be chosen to be as small as possible and as close to one another as possible.

One concept associated with the invention is based on integrating geometric areas into a circuit board arrangement 6, 14a which are constructed so as to induce opposite currents and/or voltages that cancel one another out. It is possible to implement this concept with any desired area structure. In this case, in their simplest implementation, the areas A1, A2 should always be spanned oppositely, and the structure sections of the conductor track should be constructed identically but respectively in an inverted fashion. This is technically the simplest to implement since the areas spanned by the structure sections 11a, 11b merely have to be mirrored and this can be realized in a simple manner in modern routing programs.

In specific cases, it may be necessary to depart from a regular inverting structure during routing. This may be the case, for example, if a component or some other object interrupts the regular routing. Generally, structure sections need not have an identical shape, even if the latter can be implemented more rapidly and more simply. What is more important is that structure sections are aligned oppositely in relation to the z-direction and bring about an equal and opposite induced voltage/induced current. This will generally be the case if the structure sections span the same (or approximately the same) area. Exceptions are particularly great gradients/magnetic field changes, spanning of large areas or magnetic fields that do not have a linear profile. In this case, the profile of the changing magnetic field should be included in the routing. This can have the effect that the areas spanned by structure sections of a structure section pair are of different sizes, but nevertheless bring about equal and opposite induced voltages.

The configuration of the circuit board arrangement according to the invention does not just concern circuit board arrangements of PET electronics, but rather can be applied to all electronics within the imaging device or within gradient fields (e.g. an MRI or MPI imaging device). Furthermore, it can be applied to all electronics in rapidly switching (100 Hz-100 kHz) magnetic fields. For non-differential lines, in particular, it affords a realization possibility for minimizing induced voltages and currents.

According to one aspect of the invention and for reasons mentioned initially, it is not possible to avoid inducing voltages in the case of supply, as long as slots have to be introduced into the circuit board arrangement. It is likewise not possible to prevent induced voltages and currents in U- and L-shaped structures on (non-differential) signal lines. In order nevertheless to minimize induced disturbances, the invention provides for routing the supply and signal lines such that they form structure sections in which the induced voltages and currents run along the same direction. These structure sections are then constructed alternately in opposite directions, with the result that the induced voltages and currents along the entire signal or supply lines cancel one another out.

LIST OF REFERENCE SIGNS

1 Resonator structure
2 Gradient coil system
3 Main magnet
4 Scintillator crystals
5 Photosensor
6 Circuit board arrangement according to the invention
6' Circuit board arrangement in accordance with the prior art
7a Signal lines (conductor tracks) according to the invention
7a', 7b' Signal lines in accordance with the prior art
8a, 8b Electronic components
9 Plug connector
10 Conductor track sections
11a, 11b Structure sections
11 Structure section pair
12 Supply layer (conductor track) according to the invention
12' Supply layer (conductor track) in accordance with the prior art
13 Slots in supply layer according to the invention
13 Slots in supply layer in accordance with the prior art
14 Multilayered circuit board arrangement according to the invention
14' Circuit board arrangement in accordance with the prior art
14a, 14b Circuit board layers of a multilayered circuit board arrangement according to the invention
15a, 15b, 15c Conductor track segments
16 Through contacts
A' Area spanned by signal lines 7a'
A1 Area spanned by a structure section 11a
A2 Area spanned by a structure section 11b
B Changing magnetic field (e.g. gradient field of a gradient coil system)
z Longitudinal axis of the magnetic field coil system

LITERATURE LIST

[1] Berneking, Arne, et al.
"RF Coil Performances in Compact Hybrid MR/PET Scanner Design Using an Integrated Shielding",
ISMRM 2017
[2] Berneking, Arne, et al.
"Design and Characterization of a Gradient-Transparent RF Copper Shield for PET Detector Modules in Hybrid MR-PET Imaging."
IEEE Transactions on Nuclear Science 64.5 (2017): 1118-1127
[3] U.S. Pat. No. 9,488,703 B2
[4] WO 2017186687
[5] DE 10 2005 033 989

What is claimed is:

1. An imaging device comprising:
   a. a magnet arrangement arranged radially around a sample volume and configured to generate a magnetic field B with a magnetic field component in a z-direction, wherein the magnetic field B changes during operation of the magnet arrangement,
   b. a circuit board arrangement arranged radially within the magnet arrangement and having electrical conductor tracks divided into conductor track sections,
   wherein the electrical conductor tracks are planar supply conductor tracks configured to supply only DC voltage,
   wherein at least two of the conductor track sections adjoining one another form a structure section spanning an area,
   wherein two respective ones of the structure sections form a structure section pair for each conductor track,
   wherein the conductor tracks are arranged on the circuit board arrangement such that a change in the magnetic field B of the magnet arrangement induces equal and opposite voltages and/or currents in the two structure sections of each said respective structure section pair.

2. The imaging device as claimed in claim 1, wherein, in each structure section, at least two conductor track sections are aligned at an oblique angle with respect to the z-direction, and wherein a sign of the angle formed between the conductor track and the z-axis changes in directional course at least once along the conductor track.

3. The imaging device as claimed in claim 2, wherein the conductor tracks extend in zigzag directions on the circuit board arrangement.

4. The imaging device as claimed in claim 2, wherein the oblique angle between the conductor track sections of the structure section with respect to the z-direction is 30° to 60°.

5. The imaging device as claimed in claim 4, wherein the oblique angle between the conductor track sections of the structure section with respect to the z-direction is at least approximately 45°.

6. The imaging device as claimed claim 1, where the structure sections of the respective structure section pair have at least one conductor track section in common.

7. The imaging device as claimed in claim 1, wherein the areas spanned by the structure sections of the structure section pair have mutually same shapes and mutually same surface areas.

8. The imaging device as claimed in claim 1, wherein the circuit board arrangement is a multilayered arrangement, and wherein the conductor track sections extend at least partly over a plurality of circuit board layers of the multi-layered arrangement.

9. The imaging device as claimed in claim 8, wherein the electrical conductor tracks are signal lines configured to transmit electrical signals and/or are planar supply conductor tracks configured to supply voltage, and wherein the planar supply conductor tracks and at least one of the signal lines are arranged at least on one of the circuit board layers.

10. The imaging device as claimed in claim 1, wherein the magnet arrangement is a gradient system of a magnetic resonance imaging (MRI) unit or of a magnetic particle imaging (MPI) unit.

11. The imaging device as claimed in claim 1, wherein the circuit board arrangement comprises emission tomography electronics.

12. The imaging device as claimed in claim 11, wherein the circuit board arrangement comprises positron emission tomography (PET) electronics or single photon emission computed tomography (SPECT) electronics.

13. A method for designing a circuit board arrangement for an imaging device as claimed in claim 1, wherein the circuit board arrangement comprises electrical conductor tracks divided into conductor track sections, wherein at least two of the conductor track sections adjoining one another form a structure section spanning an area, comprising:

selecting a geometric course of the conductor tracks on the circuit board arrangement such that each conductor track has structure section pairs comprising respectively two structure sections in which a change in the magnetic field B of the magnet arrangement induces the equal and opposite voltages and/or currents.

14. The method as claimed in claim 13, wherein parameters for selecting the geometric course include a length of the conductor track sections and angles at which the conductor track sections are aligned relative to the z-direction.

15. The method as claimed in claim 13, wherein said selecting comprises determining sizes and/or geometric shapes of the areas spanned by the structure sections depending on a magnetic field profile and/or a gradient field profile of the imaging device.

* * * * *